United States Patent
Wu et al.

(10) Patent No.: US 9,564,832 B2
(45) Date of Patent: Feb. 7, 2017

(54) CIRCUIT FOR SYNCHRONOUSLY SWITCHING SERIES CONNECTED ELECTRONIC SWITCHES

(71) Applicant: GE Energy Power Conversion Technology Ltd, Rugby Warwickshire (GB)

(72) Inventors: Tao Wu, Nanjing (CN); Yingqi Zhang, Shanghai (CN); Fan Zhang, Shanghai (CN); Kunlun Chen, Shanghai (CN); Xin Hao, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 508 days.

(21) Appl. No.: 14/053,872

(22) Filed: Oct. 15, 2013

(65) Prior Publication Data

US 2014/0104911 A1    Apr. 17, 2014

(30) Foreign Application Priority Data

Oct. 16, 2012    (CN) .......................... 2012 1 0392576

(51) Int. Cl.
*H02M 7/537*    (2006.01)
*H03K 17/10*    (2006.01)
(Continued)

(52) U.S. Cl.
CPC ........... *H02M 7/537* (2013.01); *H03K 17/107* (2013.01); *G02F 1/1339* (2013.01); *G02F 2001/133311* (2013.01); *G02F 2001/133357* (2013.01)

(58) Field of Classification Search
CPC .......... H02M 7/537; H02M 3/22; H02M 7/42; H02M 7/487; H02M 1/14; H03K 17/107; H03K 17/00; H03K 17/10; H03K 17/785; H03K 17/79; G02F 1/1339; G02F 2001/133311; G02F 2001/133357
(Continued)

(56) References Cited

U.S. PATENT DOCUMENTS 5,909,138 A    6/1999    Stendahl
5,946,178 A    8/1999    Bijlenga
(Continued)

FOREIGN PATENT DOCUMENTS

CN    1665117 A    9/2005
EP    2164157 A2    3/2010

OTHER PUBLICATIONS

Withanage et al., "Series Connection of Insulated Gate Bipolar Transistors (IGBTs)", Power Electronics, IEEE Transactions, Issue Date: Apr. 2012, pp. 2204-2212, vol. 27, Issue:4, ISSN :0885-8993.
(Continued)

*Primary Examiner* — Jessica Han
*Assistant Examiner* — Demetries A Gibson
(74) *Attorney, Agent, or Firm* — GE Global Patent Operation; Scott R. Stanley

(57) ABSTRACT

A circuit includes first and second electronic switches, first and second excitation circuits, and first and second inductors. The first and second electronic switches are electrically coupled in series. The first and second excitation circuits are used for respectively controlling the first and second electronic switches to be turned on and turned off and are configured to synchronously switch the first and second electronic switches. The first inductor is electrically coupled between the first excitation circuit and the first electronic switch, for transmitting the switch control signal of the first excitation circuit to the first electronic switch. The second inductor is electrically coupled between the second excitation circuit and the second electronic switch, for transmitting
(Continued)

the switch control signal of the second excitation circuit to the second electronic switch.

16 Claims, 12 Drawing Sheets

(51) Int. Cl.
 *G02F 1/1339* (2006.01)
 *G02F 1/1333* (2006.01)
(58) Field of Classification Search
 USPC .............. 363/56.01, 56.02, 56.03, 56.04,
 56.05,363/56.06, 56.07, 56.08, 132, 133, 134
 See application file for complete search history.

(56) References Cited

U.S. PATENT DOCUMENTS

| | | | |
|---|---|---|---|
| 6,111,465 A * | 8/2000 | Kakuta .................... | H01F 19/04 330/276 |
| 6,239,988 B1 * | 5/2001 | Marziale .............. | H03K 17/105 363/16 |
| 6,268,990 B1 | 7/2001 | Ogura et al. | |
| 6,320,362 B1 | 11/2001 | Baek et al. | |
| 6,333,604 B1 * | 12/2001 | Robb ...................... | F02P 3/051 307/10.6 |
| 6,424,114 B1 * | 7/2002 | Komatsu ................... | H02P 1/50 310/68 R |
| 6,946,885 B1 | 9/2005 | Rockot et al. | |
| 7,508,096 B1 * | 3/2009 | Kumfer .................. | H03K 17/10 307/112 |
| 2002/0175644 A1 | 11/2002 | Su | |
| 2004/0233690 A1 * | 11/2004 | Ledenev .............. | H02M 3/1584 363/133 |
| 2006/0284670 A1 * | 12/2006 | Eid ........................... | H03F 1/14 327/563 |
| 2009/0190378 A1 * | 7/2009 | Ishii ...................... | B23K 9/1056 363/21.01 |
| 2010/0165664 A1 * | 7/2010 | Terashi ................. | H03K 17/691 363/15 |
| 2010/0178550 A1 * | 7/2010 | Kasmer ................ | H01M 10/123 429/160 |
| 2011/0204835 A1 | 8/2011 | Gollentz | |
| 2011/0222325 A1 | 9/2011 | Komatsu | |
| 2012/0134180 A1 * | 5/2012 | Watanabe ............ | H02M 3/1584 363/17 |
| 2012/0230076 A1 | 9/2012 | Palmer et al. | |
| 2013/0099831 A1 * | 4/2013 | Permuy ................... | H03K 17/10 327/109 |
| 2015/0014746 A1 * | 1/2015 | Inada ................ | H01L 29/41725 257/192 |

OTHER PUBLICATIONS

Unofficial English translation of Office Action issued in connection with corresponding CN Application No. 201210392576.8 on Feb. 24, 2016.

* cited by examiner

CIRCUIT FOR SYNCHRONOUSLY SWITCHING SERIES CONNECTED ELECTRONIC SWITCHES

BACKGROUND

Embodiments of the invention relate generally to a circuit comprising at least two electronic switches which are electrically coupled in series and where the circuit is capable of synchronously switching the at least two electronic switches.

AC motors are commonly supplied with electrical power from a DC supply bus, to the terminals of which there are connected the different phases of the motors via an inverter which is constituted by switch units whose state is controlled by an appropriate control system.

For example, for high power pump or compressor motor drives, large amount of electrical power is converted by the switch units to provide the electrical energy for the motor drives. Typically, the switch units are constituted by multiple transistors of the insulated gate bipolar transistor (IGBT) type for example. For avoiding damaging the IGBTs because of the high levels of electrical power, it is advantageous to couple in series at least two IGBTs as a single switch unit such that the voltage stress of the series connected IGBTs can be reduced.

The at least two IGBTs which are thus coupled in series should be controlled with complete synchronization so that they correspond to a single switch unit in terms of function. Synchronization errors between IGBTs result in the excessive voltage sustained by only one of the IGBTs, which may bring about the damage thereof. Taking into account the production tolerances of the IGBTs and the precision of the control system, the synchronization of the operation of the IGBTs is difficult to be achieved. Sophisticated electronic control solutions have been developed, however, these solutions require the use of specific integrated circuits which are very costly and complex.

For these and other reasons, there is a need for simpler and low cost circuit designs which are capable of synchronously switching.

BRIEF DESCRIPTION

In accordance with an embodiment of the invention, a circuit is provided. The circuit includes first and second electronic switches, first and second excitation circuits, and first and second inductors. The first and second electronic switches are electrically coupled in series. The first and second excitation circuits are used for respectively controlling the first and second electronic switches to be turned on and turned off and are configured to synchronously switch the first and second electronic switches. The first and second inductors are magnetically coupled between each other. The first inductor is electrically coupled between the first excitation circuit and the first electronic switch, for transmitting the switch control signal of the first excitation circuit to the first electronic switch. The second inductor is electrically coupled between the second excitation circuit and the second electronic switch, for transmitting the switch control signal of the second excitation circuit to the second electronic switch.

In accordance with another embodiment of the invention, a circuit is provided. The circuit includes first, second, and third electronic switches, first, second, and third excitation circuits, and first, second, third, and fourth inductors. The first, second, and third electronic switches are electrically coupled in series. The first, second, and third excitation circuits are used for respectively controlling the first, second, and third electronic switches to be turned on and turned off. The first, second, third excitation circuits are configured to synchronously switch the corresponding electronic switches. The first and second inductors are magnetically coupled between each other. The third and fourth inductors are magnetically coupled between each other. The first inductor is electrically coupled between the first excitation circuit and the first electronic switch, for transmitting the switch control signal of the first excitation circuit to the first electronic switch. The second inductor and the third inductor are electrically coupled in series and then the second and third inductors are electrically coupled between the second excitation circuit and the second electronic switch, for transmitting the switch control signal of the second excitation circuit to the second electronic switch. The fourth inductor is electrically coupled to the third excitation circuit and between the third electronic switch, for transmitting the switch control signal of the third excitation circuit to the third electronic switch.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the invention relate to a circuit. The circuit includes first and second electronic switches, first and second excitation circuits, first and second inductors. The first and second electronic switches are electrically coupled in series. The first and second excitation circuits are used for controlling the respective electronic switches to be turned on and turned off. The first and second excitation circuits are configured to synchronously switch the first and second electronic switches. The first and second inductors are magnetically coupled between each other. The first inductor is electrically coupled between the first excitation circuit and the first electronic switch, for transmitting the switch control signal of the first excitation circuit to the first electronic switch. In a similar fashion, the second inductor is electrically coupled between the second excitation circuit and the second electronic switch, for transmitting the switch control signal of the second excitation circuit to the second electronic switch.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Figure 1:
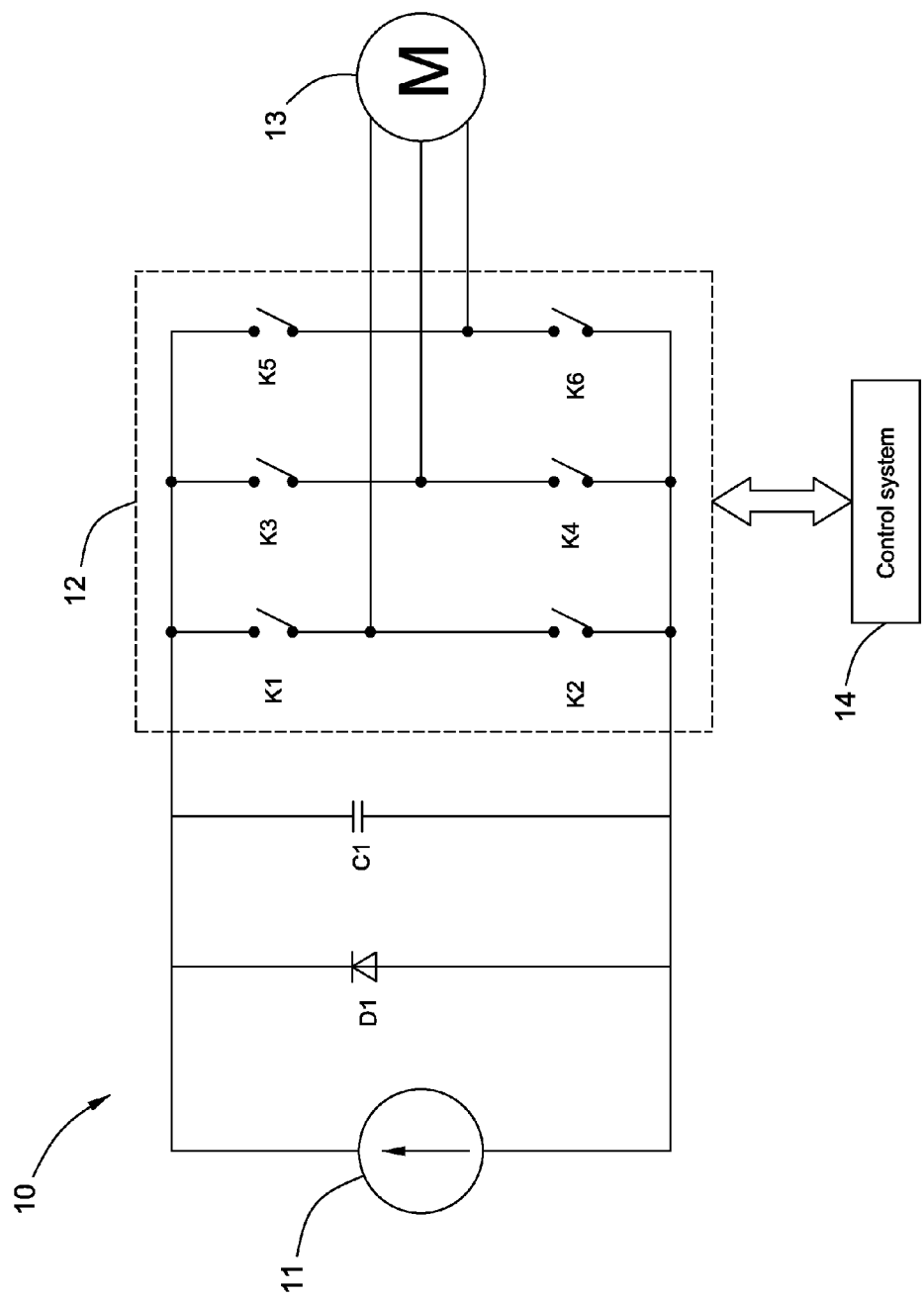
FIG. 1 is a schematic view of a DC/AC circuit according to one embodiment.

Referring to FIG. 1, a DC/AC circuit 10 according to one embodiment is shown. In this illustrated embodiment, the DC/AC circuit 10 includes a DC supply 11, a multi-phase inverter such as a three-phase inverter 12, an AC motor 13, and a control system 14. The control system 14 outputs control commands to control the multi-phase inverter 12, which can convert the DC voltage from the DC supply 11 into AC voltage to the AC motor 13 via the inverter 12. It is understood that the DC/AC circuit 10 may further include other additional elements, such as a diode D1, a capacitor C1 shown in FIG. 1 and other un-shown elements which are known technology.

The multi-phase inverter 12 may include multiple switch units, for example as shown, six switch units K1-K6 corresponding to a three-phase inverter may be employed, which are operated by the control of the control system 14. The AC motor 13 may need a high level voltage to drive; therefore each of the switch units K1-K6 should undertake the high level voltage. To prevent the switch units K1-K6 to be damaged by the high level voltage, each of the switch units K1-K6 is configured to include at least two series connected electronic switches as a single switch unit, such as by using two series connected IGBTs. As such, the IGBTs, can share the high level voltage on each of the two series connected electronic switches. Therefore, each of the electronic switches is exposed to a relative low level voltage which is under the allowable range of each electronic switch. The number and type of the series connected electronic switches may vary according to the actual voltage level needs and the characteristic of the used electronic switches.

Furthermore, the series connected electronic switches should have a synchronized control so that they correspond to a single switch unit in terms of function. The following describes embodiments of the invention whereby the control system 14 functions to synchronously switch the series connected electronic switches by using low cost and simple circuits.

Figure 2:
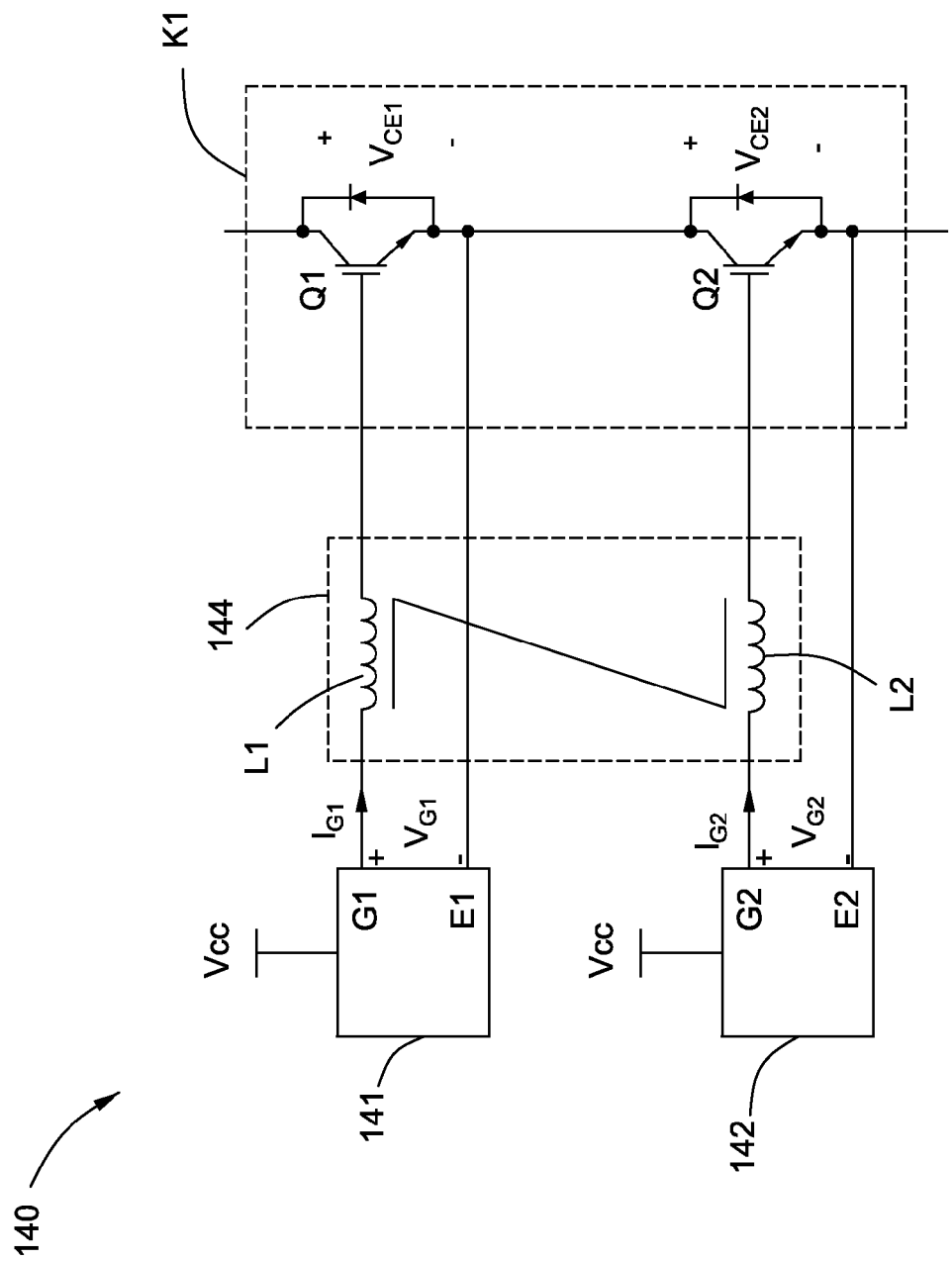
FIG. 2 is a circuit diagram of a circuit for switching two electronic switches of a switch unit of the DC/AC circuit of FIG. 1, according to one embodiment.

FIG. 2, is one embodiment illustrating a circuit 140 for switching two series connected electronic switches Q1 and Q2 of a switch unit K1 of the DC/AC circuit 10 of FIG. 1. In this illustrated embodiment, the number of the series connected electronic switches of the switch unit K1 is two and the type of the electronic switches Q1 and Q2 is IGBT. The number and the type of the electronic switches may vary if needed. The other switch units K2-K6 have similar configuration as the switch unit K1, thus only the switch unit K1 is described hereinafter. In other embodiments, the circuit 140 also can be used in an AC/DC circuit by using the similar manner.

Typically, the circuit 140 includes two excitation circuits 141 and 142, for respectively controlling the two electronic switches Q1 and Q2 to be turned on and turned off according to control commands from the control system 14. The excitation circuit 141 includes a driving terminal G1 electrically coupled to the gate of the electronic switch Q1, and a ground terminal E1 electrically coupled to the emitter of the electronic switch Q1. Similarly, the excitation circuit 142 includes a driving terminal G2 electrically coupled to the gate of the electronic switch Q2, and a ground terminal E2 electrically coupled to the emitter of the electronic switch Q2.

For implementing synchronously switch to the two electronic switches Q1 and Q2 through the two excitation circuits 141 and 142, two magnetically coupled inductors L1 and L2 as a synchronously inducting circuit 144 are introduced in the circuit 140. The inductor L1 is electrically coupled between the driving terminal G1 of the excitation circuit 141 and the gate of the electronic switch Q1, and the inductor L2 is electrically coupled between the driving terminal G2 of the excitation circuit 142 and the gate of the electronic switch Q2.

Figure 3:
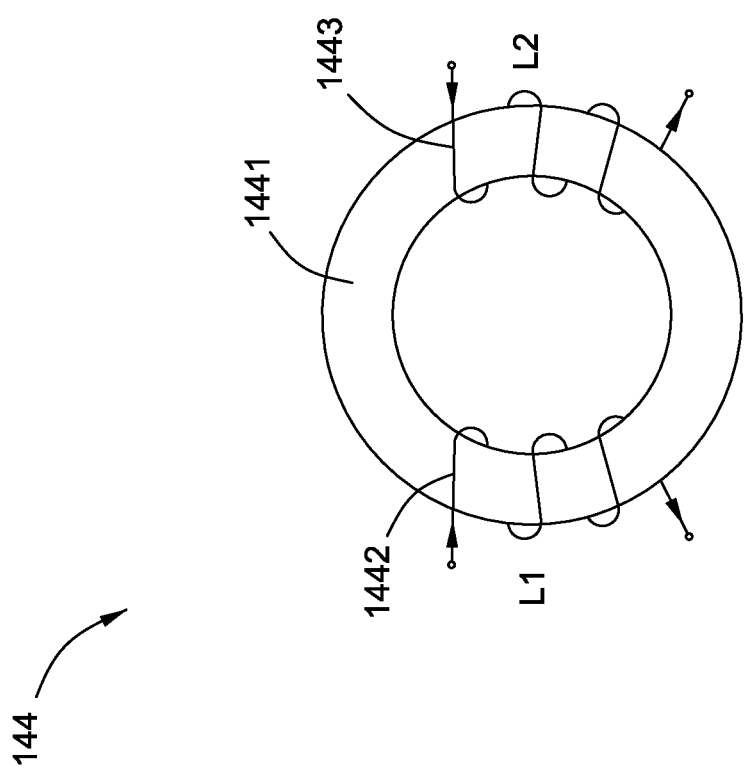
FIG. 3 is a schematic view of two magnetically coupled inductors of the circuit of FIG. 2, according to one embodiment.

Referring to FIG. 3, a schematic view of the two magnetically coupled inductors L1 and L2 according to one embodiment is shown. In this illustrated embodiment, the two magnetically coupled inductors L1 and L2 include a common magnetic core, such as a ring-shaped magnetic core 1441, a first winding 1442, and a second winding 1443. The first winding 1442 and the second winding 1443 are respectively wound on different positions of the magnetic core 1441, for example arranged symmetrically. The first winding 1442 together with the magnetic core 1441 acts as the inductor L1 in the synchronously inducting circuit 144. The second winding 1443 together with the magnetic core 1441 acts as the inductor L2 in the synchronously inducting circuit 144. The two windings 1442 and 1443 may have high level voltage interference to each other, thus the two windings 1442 and 1443 are arranged on the magnetic core 1441 in an insulation mode, such as by using an air insulation mode or the like to reduce interference. Furthermore, in certain embodiments, the turn ratio of the first winding 1442 and the second winding 1443 is 1:1. In other embodiments, the shape of the common magnetic core may vary such as can be a rectangle-shape.

Figure 4:
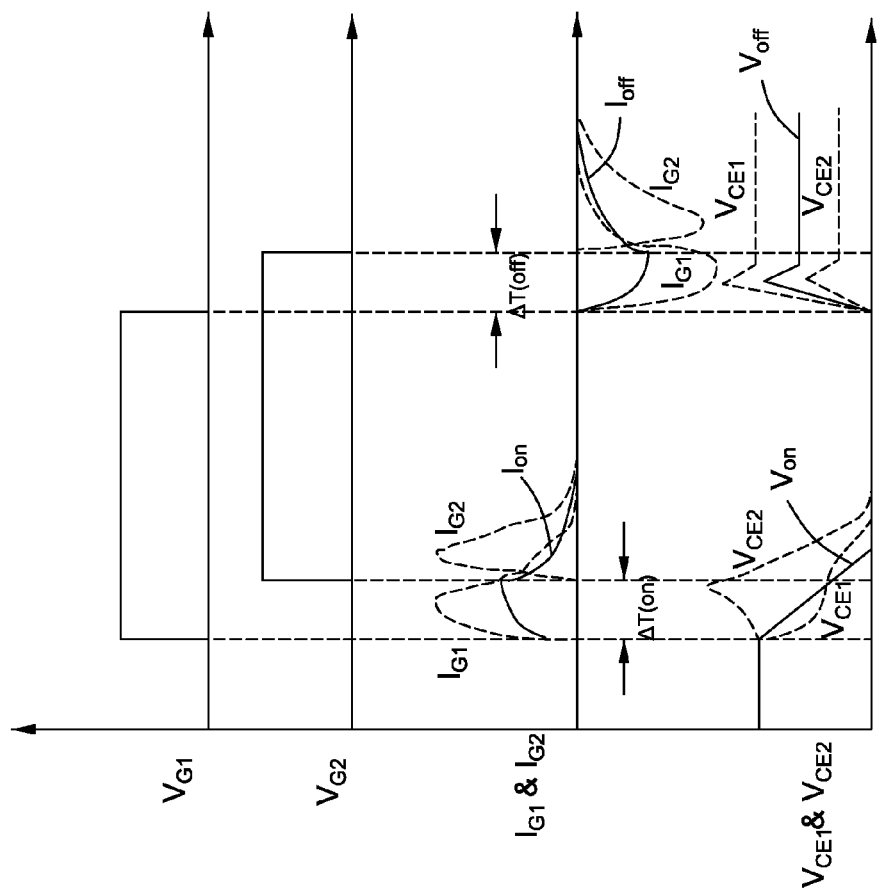
FIG. 4 is a comparison view of voltage and current simulation waves of the circuit of FIG. 2, with and without the magnetically coupled inductors.

Referring to FIG. 2 and FIG. 4 together, FIG. 4 shows a comparison view of voltage and current simulation waves of the circuit 140 of FIG. 2, with and without the magnetically coupled inductors L1 and L2. It is assumed that there exhibits a timing difference $\Delta T$ between the driving voltage $V_{G1}$ of the excitation circuit 141 and the driving voltage $V_{G2}$ of the excitation circuit 142 for some reasons. For illustrative purpose, the driving voltage $V_{G1}$ is faster than the driving voltage $V_{G2}$ as an example.

When the two magnetically coupled inductors L1 and L2 are not applied in the circuit 140, namely the driving terminal G1 is directly electrically coupled to the gate of the electronic switch Q1, and the driving terminal G2 is directly electrically coupled to the gate of the electronic switch Q2, at the time when the driving voltage $V_{G1}$ (namely the switch control signal to the electronic switch Q1) reaches to a rising edge, the electronic switch Q1 is turned on, and at the time when the driving voltage $V_{G1}$ reaches to a failing edge, the electronic switch Q1 is turned off. Similarly, at the time when the driving voltage $V_{G2}$ (namely the switch control signal to the electronic switch Q2) reaches to a rising edge, the electronic switch Q2 is turned on, and at the time when the driving voltage $V_{G2}$ reaches to a failing edge, the electronic switch Q2 is turned off. Wherein, in electronics, a signal edge is a transition in a digital signal either from low to high (0 to 1) or from high to low (1 to 0). It is called an "edge" because the square wave which represents a signal has edges at those points. A "rising edge" is the transition from low to high. A "falling edge" is the transition from high to low.

Due to timing difference ΔT exhibits between the driving voltage $V_{G1}$ and the driving voltage $V_{G2}$, the driving current $I_{G1}$ through the gate of the electronic switch Q1 is not synchronous with the driving current $I_{G2}$ through the gate of the electronic switch Q2. In other words, the driving current $I_{G1}$ is faster than the driving current $I_{G2}$ (see the dotted lines of FIG. 4). At this point, the collect-emitter voltage $V_{CE2}$ of the electronic switch Q2 is much greater than the collect-emitter voltage $V_{CE1}$ of the electronic switch Q1 during the turn-on interval ΔT(on) (see the dotted lines of FIG. 4), which may result in damage to the electronic switch Q2. Similarly, the collect-emitter voltage $V_{CE1}$ of the electronic switch Q1 is much greater than the collect-emitter voltage $V_{CE2}$ of the electronic switch Q2 during the turn-off interval ΔT(off) (see the dotted lines of FIG. 4), which may result in damage to the electronic switch Q1.

When the two magnetically coupled inductors L1 and L2 are applied in the circuit 140, namely the driving terminal G1 is electrically coupled to the gate of the electronic switch Q1 through the inductor L1, and the driving terminal G2 is electrically coupled to the gate of the electronic switch Q2 through the inductor L2, the voltage imbalance between the two series connected electronic switches Q1 and Q2 will be significantly reduced. In detail, during the turn-on interval ΔT(on), Q1 is turned on faster than that Q2. Therefore, the driving current $I_{G1}$ flows earlier than the driving current $I_{G1}$. This would induce a positive voltage across the winding 1442 of the inductor L1 and induce a negative voltage across the winding 1443 of the inductor L2, which can synchronize the driving current $I_{G1}$ and the driving current $I_{G2}$ to become a synchronized driving current $I_{on}$ (see the solid lines of FIG. 4), and then synchronize the collect-emitter voltage $V_{CE1}$ and the collect-emitter voltage $V_{CE1}$ to become a synchronized collect-emitter voltage $V_{on}$ (see the solid lines of FIG. 4).

In a similar manner, during the turn-off interval ΔT(off), the driving current $I_{G1}$ and the driving current $I_{G2}$ are synchronized to a driving current $I_{off}$ (see the solid lines of FIG. 4), and then the collect-emitter voltage $V_{CE1}$ and the collect-emitter voltage $V_{CE1}$ are synchronized to a collect-emitter voltage $V_{off}$ (see the solid lines of FIG. 4). Due to the input signals of the two series connected electronic switches, Q1 and Q2 are synchronized through the regulation of the magnetically coupled inductors L1 and L2, the gate voltage of each of the electronic switches Q1 and Q2 will be within an allowable range, which may prevent Q1 and Q2 from being damaged.

Figure 5:
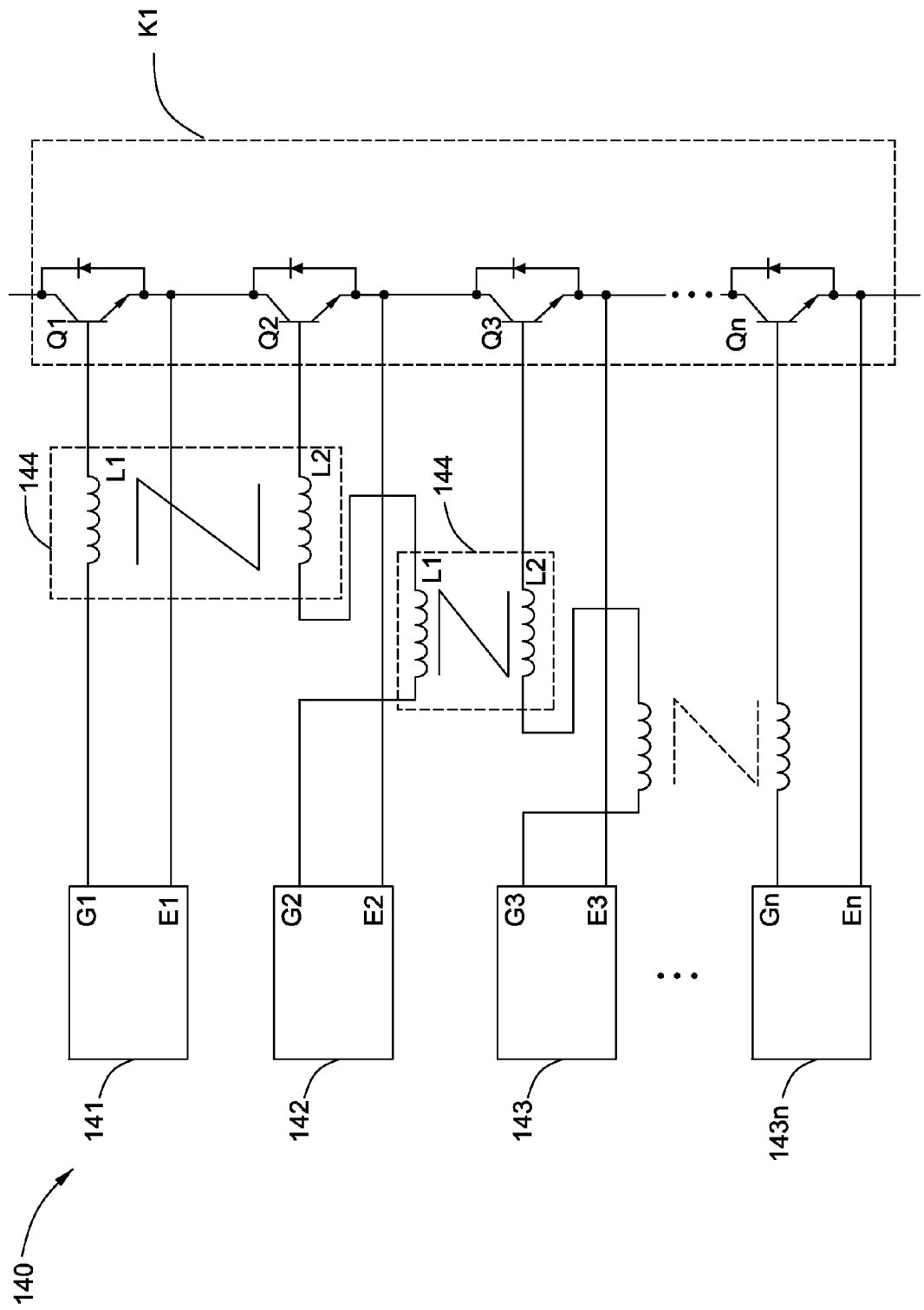
FIG. 5 is a circuit diagram of a circuit for switching multiple electronic switches of a switch unit of the DC/AC circuit of FIG. 1, according to one embodiment.

As mentioned above, each switch unit, such as the switch unit K1, includes at least two series connected electronic switches as a single switch unit. When the number of the electronic switches is greater than two, the number of the synchronously inducting circuit 144 will be increased accordingly. The number of electronic switches is equal to the number of synchronously inducting circuit 144 plus one. FIG. 5 is an illustration of one embodiment which shows a circuit diagram of the circuit 140 for switching more than two electronic switches Q1, Q2 . . . Qn of the switch unit K1 of the DC/AC circuit 10 of FIG. 1.

As further illustrated in FIG. 5 except for the first and the last excitation circuits 141 and 143n, for each of the other excitation circuits, the driving terminal (such as shown G2) is connected to one inductor L1 of a synchronously inducting circuit 144 and then connected to one inductor L2 of an upper adjacent synchronously inducting circuit 144, and then connected to the gate of the corresponding electronic switch. Therefore all of the inductors L1 and L2 in the all synchronously inducting circuits 144 can induce voltage to synchronize all of the input signals of the series connected electronic switches Q1, Q2 . . . Qn. The operation principle is similar to the embodiment of FIG. 2, and thus not described again.

Figure 6:
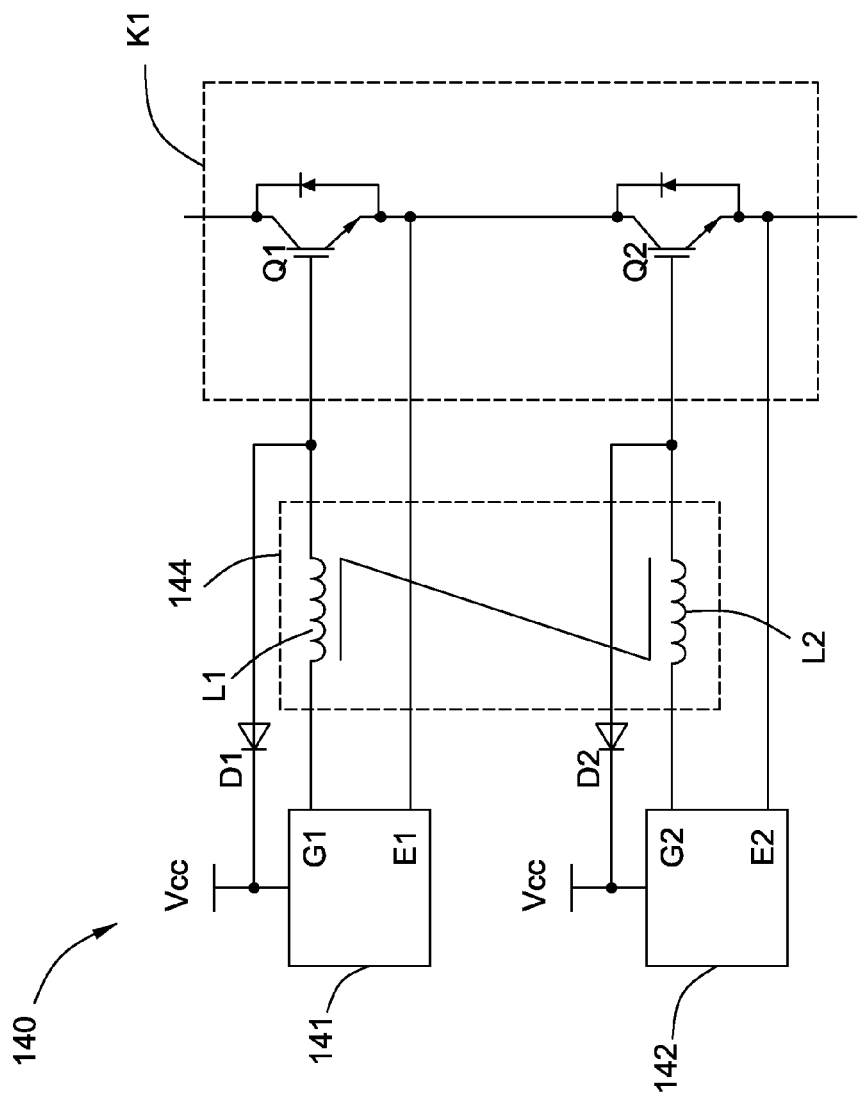
FIG. 6 is a circuit diagram of a circuit for switching two electronic switches of a switch unit of the DC/AC circuit of FIG. 1, according to another embodiment.

Based on the embodiment of FIG. 2, another embodiment is shown in FIG. 6 which further includes two clamping diodes D1 and D2. The clamping diode D1 is electrically coupled between a DC supply Vcc and the gate of the electronic switch Q1, to provide a clamping voltage to Q1. The clamping diode D2 is electrically coupled between a DC supply Vcc and the gate of Q2, to provide a clamping voltage to Q2. In the illustrated embodiment, the DC supply Vcc is the DC source of the excitation circuits 141 and 142. In other embodiments, the DC supply Vcc can be another individual DC source. The voltage level of the DC supply Vcc is under the maximum allowable voltage of the electronic switches Q1 and Q2, to insure the gate voltage of Q1 and Q2 do not exceed their maximum allowable voltage range. Similarly, for the embodiment of FIG. 5, each excitation circuit also provides a clamping diode to further protect the corresponding electronic switch.

Figure 7:
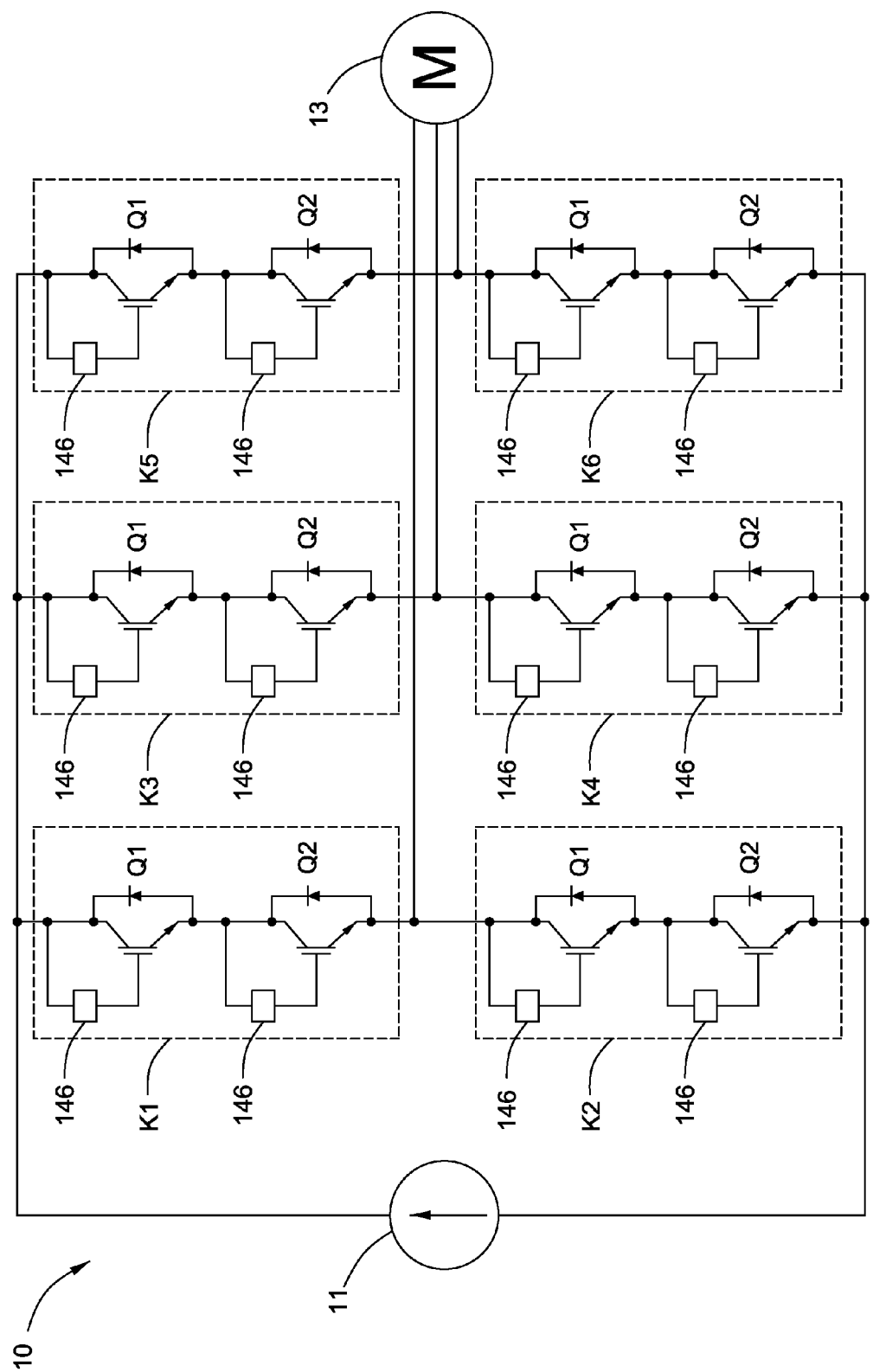
FIG. 7 is a detailed schematic view of the DC/AC circuit of FIG. 1 according to one embodiment.

Referring to FIG. 7, a schematic view of the DC/AC circuit 10 of FIG. 1 according to one embodiment is shown. As an example, each of the switch units K1 to K6 includes two series connected electronic switches Q1 and Q2. In other embodiment, as mentioned above, the number of the series connected electronic switches may vary if needed. For each of the series connected electronic switches Q1 and Q2, a clamping circuit 146 is further provided to clamp at least two different voltage levels for the corresponding electronic switch when the DC/AC circuit 10 is a multi-level power conversion circuit.

Figure 8:
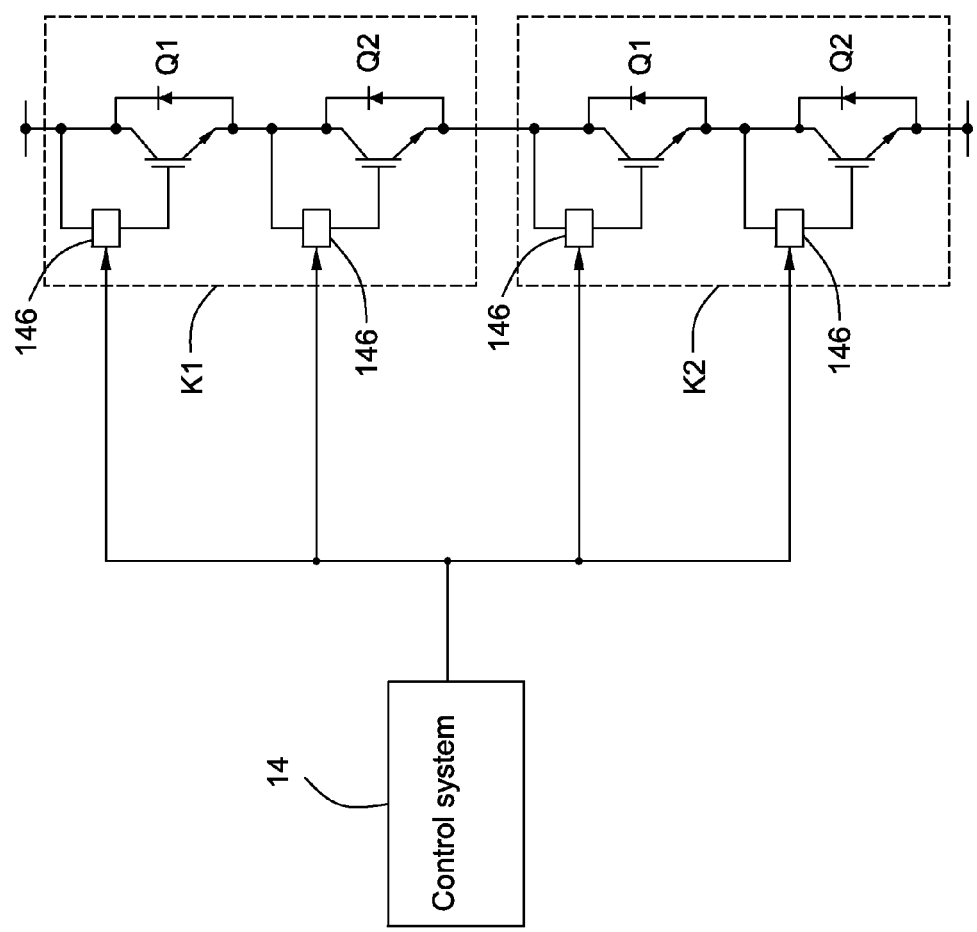
FIG. 8 is a detailed schematic view of controlling a phase of the DC/AC circuit of FIG. 7 according to one embodiment.

For clarity, only one phase of the DC/AC circuit 10 is shown in FIG. 8, and the other phases are not shown. In FIG. 8, the control system 14 outputs control signals to switch clamped voltage levels of the clamping circuits 146 to clamp different voltage levels for the corresponding electronic switches based on different clamping voltage conditions.

For example, once the series connected electronic switches Q1 and Q2 of the switch unit K1 are operated in a low voltage level, such as when the switch unit K1 sustains half of the DC link voltage, which may also be referred to as operating in a chopping mode, the clamping circuits 146 connected to Q1 and Q2 are controlled to switch to a low clamping voltage level. This provides a low clamping voltage to Q1 and Q2. Once Q1 and Q2 of the switch unit K1 are operated in a high voltage level, such as when the switch unit K1 sustains the total DC link voltage, which may also be referred to as operating in a freewheeling mode, the clamping circuits 146 are controlled to switch to a high clamping voltage level, which provides a high clamping voltage to Q1 and Q2. The clamping circuits 146 can dynamically adjust the clamping voltage levels for the switch units K1 and K2 based on their operated voltage levels. This in term may prevent a shoot-through possibility between K1 and K2.

Figure 9:
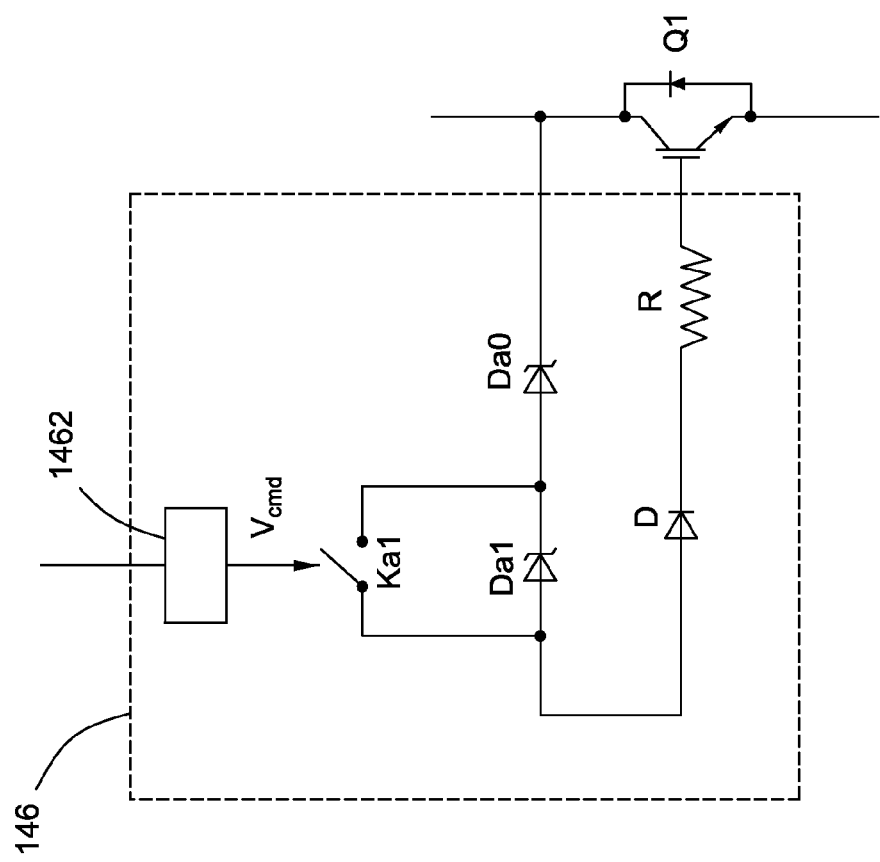
FIG. 9 is a circuit diagram of a clamping circuit for an electronic switch of the DC/AC circuit of FIG. 8 according to one embodiment.

Referring to FIG. 9, a circuit diagram of the clamping circuit 146 according to one embodiment is shown. The clamping circuit 146 includes a resistor R, a diode D, a first zener diode Da0, a second zener diode Da1, an electronic switch Ka1, and an excitation circuit 1462. The cathode of Da0 is connected to the collector of the corresponding electronic switch Q1. The anode of Da0 is connected to the cathode of Da1. The anode of Da1 is connected to the anode of the diode D. The cathode of D is connected to the gate of the corresponding electronic switch Q1 through the resistor R. The resistor R and the diode D provide the current limiting function and the current direction control function. The electronic switch Ka1 is connected between the two terminals of Da1. The excitation circuit 1462 is used to control Ka1 to be turned on and turned off according to control commands from the control system 14. The electronic switch Ka1 may be a transistor such as an IGBT, or other types of electronic switch such as a delay and so on. When Ka1 is controlled to be turned on, Da1 is not useful in the clamping circuit 146 and only Da0 is used to provide a clamping voltage. In other words, when Ka1 is controlled to be turned on, the clamping circuit 146 provides a low clamping voltage level for the electronic switch Q1. When Ka1 is controlled to be turned off, Da1 is used together with Da0 in the clamping circuit 146, which means to provide a high clamping voltage level for the electronic switch Q1. In other embodiments, the clamping circuit 146 can be changed by using other circuit configurations to provide different clamping voltage levels, such as by using some voltage adjusting chips for example.

Figure 10:
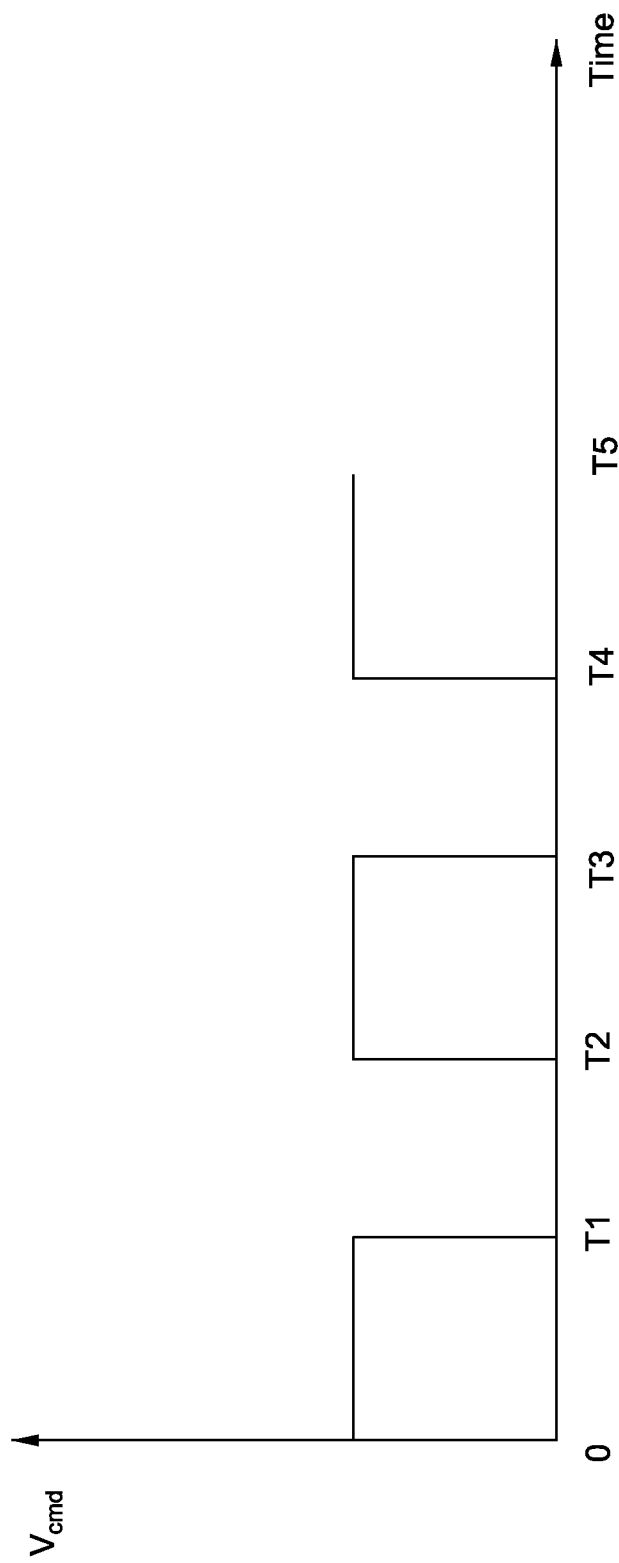
FIG. 10 is a signal wave of a switch control signal from an excitation circuit of the clamping circuit of FIG. 9.

Referring to FIG. 10, a signal wave of a switch control signal $V_{cmd}$ from the excitation circuit 1462 of the clamping circuit 146 of FIG. 9 according to one embodiment is shown. The signal wave of the switch control signal $V_{cmd}$ of the excitation circuit 1462 is a square wave as an example. During the period 0-T1, T2-T3, and T4-T5, the electronic switch Ka1 is controlled to be turned on, and during the period T1-T2 and T3-T4, Ka1 is controlled to be turned off. It is understood that the switch control signal $V_{cmd}$ can be determined in advance based on actual output voltage levels of the DC/AC circuit 10.

Figure 11:
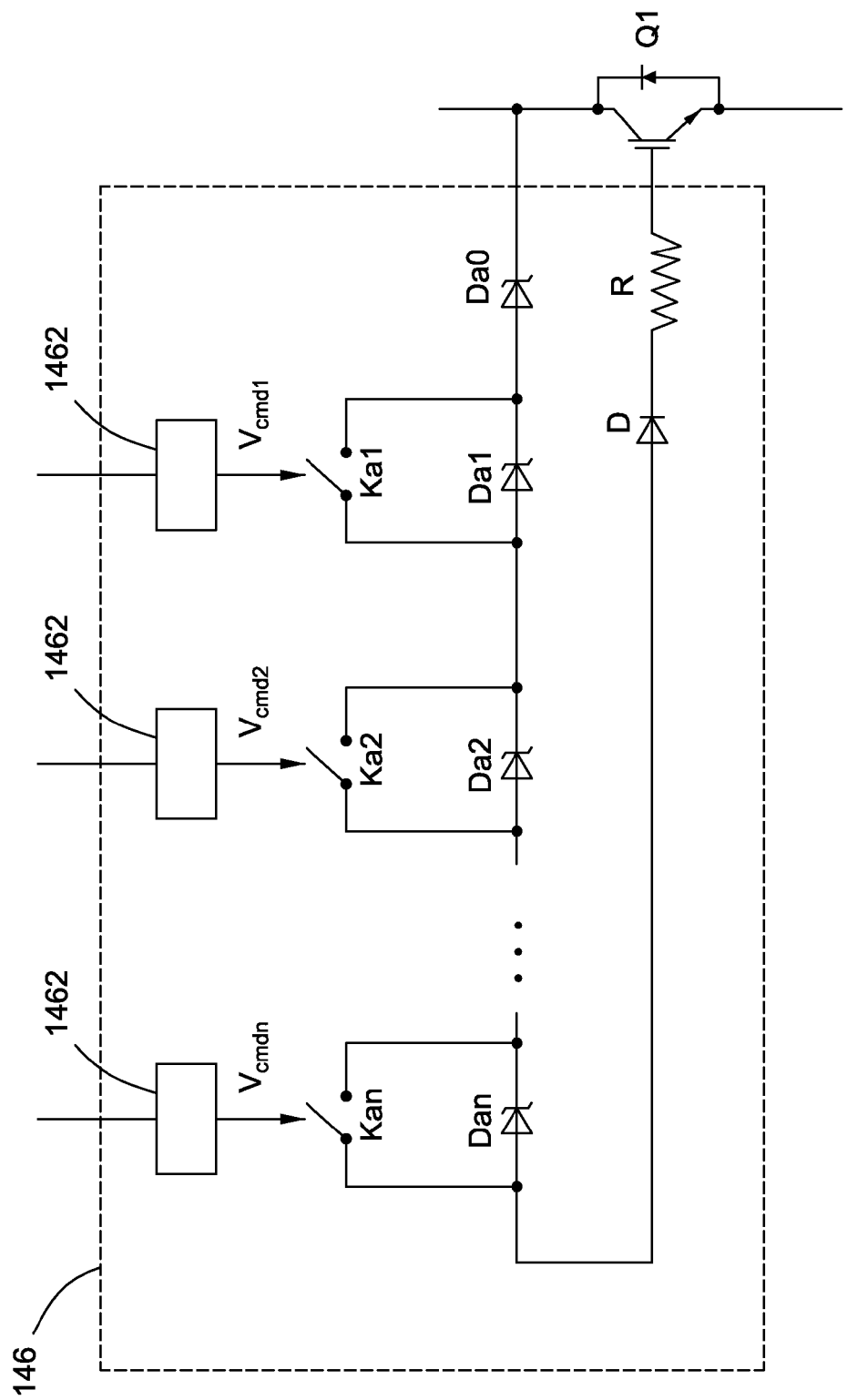
FIG. 11 is a circuit diagram of a clamping circuit for an electronic switch of the DC/AC circuit of FIG. 8 according to another embodiment.

Referring to FIG. 11, a circuit diagram of the clamping circuit 146 according to another embodiment is shown. Compared with the embodiment of FIG. 9, this illustrated embodiment provides multiple series connected zener diodes Da0, Da1, Da2 . . . Dan, and correspondingly provides multiple electronic switches Ka1, Ka2 . . . Kan respectively connected between two terminals of the zener diodes Da1, Da2 . . . Dan, and correspondingly provides multiple excitation circuits 1462 respectively used to control the electronic switches Ka1, Ka2 . . . Kan to be turned on and turned off according to control commands from the control system 14. The clamping circuit 146 of FIG. 11 can provide more than two clamping voltage levels for the corresponding electronic switch Q1 according to requirements.

Figure 12:
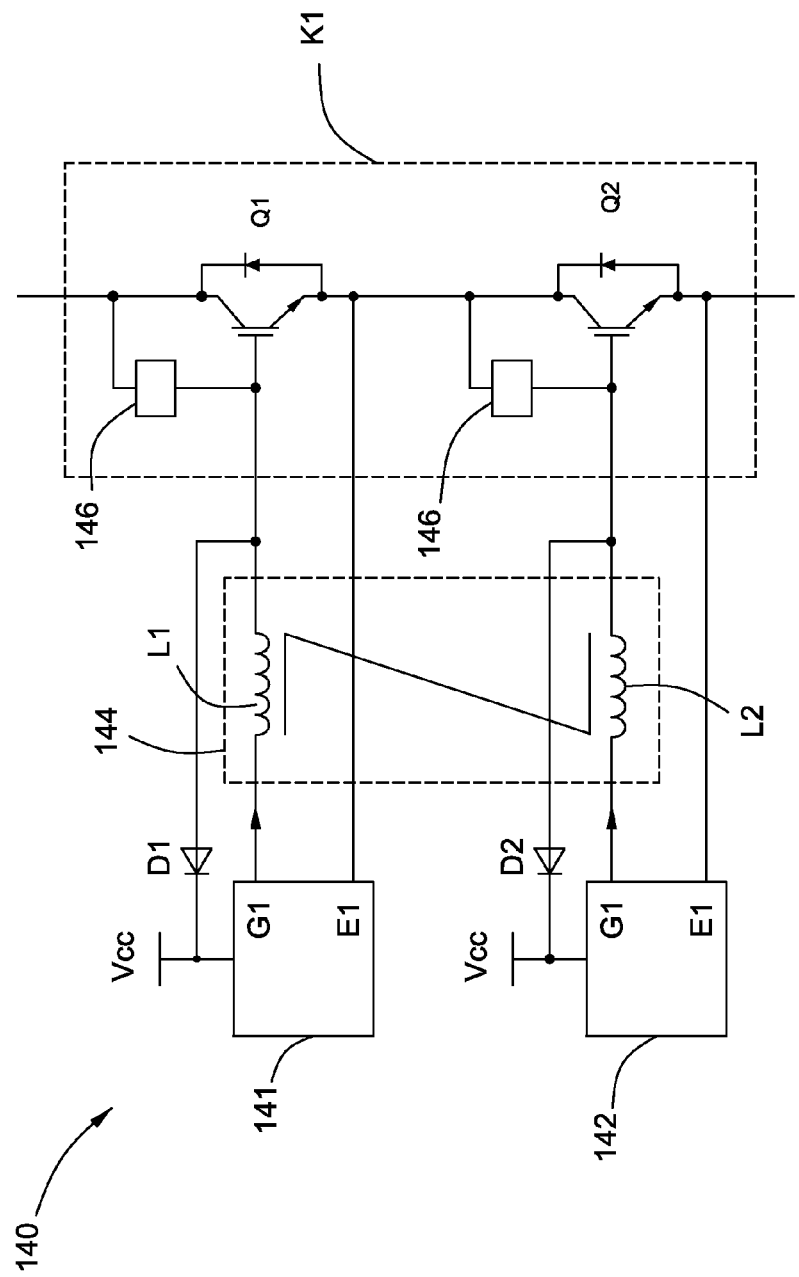
FIG. 12 is a circuit diagram of a circuit for switching two electronic switches of a switch unit of the DC/AC circuit of FIG. 1, according to yet another embodiment.

Referring to FIG. 12, a circuit 140 for switching two series connected electronic switches Q1 and Q2 of a switch unit K1 of the DC/AC circuit 10 of FIG. 1, according to another embodiment is shown. Compared with the embodiment of FIG. 6, two clamping circuits 146 (disclosed in FIG. 9) are further introduced to provide at least two clamping voltage levels for the electronic switches Q1 and Q2.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

The invention claimed is:

1. A circuit comprising:
    a first electronic switch and a second electronic switch which are electrically coupled in series;
    a first excitation circuit and a second excitation circuit, for respectively controlling the first and second electronic switches to be turned on and turned off, wherein the first and second excitation circuits are configured to synchronously switch the first and second electronic switches; and
    a first inductor and a second inductor which are magnetically coupled between each other; wherein
    the first inductor is electrically coupled between the first excitation circuit and the first electronic switch, for transmitting the switch control signal of the first excitation circuit to the first electronic switch;
    the second inductor is electrically coupled between the second excitation circuit and the second electronic switch, for transmitting the switch control signal of the second excitation circuit to the second electronic switch;
    a first clamping circuit, for providing at least two different clamping voltages to the first electronic switch; and
    a second clamping circuit, for providing at least two different clamping voltages to the second electronic switch,
    wherein each of the first clamping circuit and the second clamping circuit comprises:
        a first zener diode and a second zener diode electrically coupled in series, and both together electrically coupled between two terminals of the corresponding one of the first electronic switch and the second electronic switch;
        a third electronic switch electrically coupled between two terminals of the second zener diode; and
        a third excitation circuit for controlling the third electronic switch.

2. The circuit of claim 1, wherein the first and second magnetically coupled inductors include a common magnetic core, a first winding, and a second winding, wherein the first winding is wound on the common magnetic core acting as the first inductor, and the second winding is wound on the common magnetic core acting as the second inductor.

3. The circuit of claim 2, wherein the common magnetic core is ring-shaped.

4. The circuit of claim 2, wherein the first winding and the second winding are symmetrically wound on different positions of the common magnetic core.

5. The circuit of claim 2, wherein the turn ratio of the first winding and the second winding is 1:1.

6. The circuit of claim 2, wherein the first winding and second winding are arranged on the magnetic core in an insulation mode.

7. The circuit of claim 1, further comprising:
a first clamping diode electrically coupled between a DC supply and the first electronic switch, for providing a clamping voltage to the first electronic switch; and
a second clamping diode electrically coupled between the DC supply and the second electronic switch, for providing a clamping voltage to the second electronic switch.

8. The circuit of claim 1, wherein each of the first and second clamping circuits further comprises:
one or more third zener diodes electrically coupled to the second zener diode in series;
one or more fourth electronic switches respectively electrically coupled between two terminals of the one or more third zener diodes; and
one or more fourth excitation circuits for respectively controlling the one or more fourth electronic switches to be turned on and turned off.

9. The circuit of claim 1, wherein each of the first and second clamping circuits further comprises a diode and resistor electrically coupled to the first and second zener diodes in series.

10. The circuit of claim 1, wherein the first and second electronic switches comprise insulated gate bipolar transistors (IGBTs), the first and second zener diodes are electrically coupled between the gate and the collect terminals of the corresponding one of the first and second electronic switches.

11. A circuit comprising:
a first electronic switch, a second electronic switch, and a third electronic switch which are electrically coupled in series;
a first excitation circuit, a second excitation circuit, and a third excitation circuit for respectively controlling the first, second, and third electronic switches to be turned on and turned off, wherein the first, second and third excitation circuits are configured to synchronously switch the first, second, and third electronic switches;
a first inductor and a second inductor which are magnetically coupled to each other; and
a third inductor and a fourth inductor which are magnetically coupled between each other; wherein
the first inductor is electrically coupled to the first excitation circuit and between the first electronic switch, for transmitting the switch control signal of the first excitation circuit to the first electronic switch;
the second inductor and the third inductor are electrically coupled in series and then the second and third inductors are electrically coupled between the second excitation circuit and the second electronic switch, for transmitting the switch control signal of the second excitation circuit to the second electronic switch; and
the fourth inductor is electrically coupled to the third excitation circuit and between the third electronic switch, for transmitting the switch control signal of the third excitation circuit to the third electronic switch.

12. The circuit of claim 11, wherein the first, second, and third electronic switches comprise insulated gate bipolar transistors (IGBTs).

13. The circuit of claim 11, wherein:
a driving terminal of the first excitation circuit is electrically coupled to the gate of the first electronic switch through the first inductor, a ground terminal of the first excitation circuit is electrically coupled to the emitter of the first electronic switch;
a driving terminal of the second excitation circuit is electrically coupled to the gate of the second electronic switch through the second and third inductors, a ground terminal of the second excitation circuit is electrically coupled to the emitter of the second electronic switch; and
a driving terminal of the third excitation circuit is electrically coupled to the gate of the third electronic switch through the fourth inductor, a ground terminal of the third excitation circuit is electrically coupled to the emitter of the third electronic switch.

14. The circuit of claim 11, wherein:
the first and second magnetically coupled inductors include a first common magnetic core, a first winding, and a second winding; the first winding is wound on the first common magnetic core acting as the first inductor and the second winding is wound on the first common magnetic core acting as the second inductor; and
the third and fourth magnetically coupled inductors include a second common magnetic core, a third winding, and a fourth winding; the third winding is wound on the second common magnetic core acting as the third inductor, the fourth winding is wound on the second common magnetic core acting as the fourth inductor.

15. The circuit of claim 11, further comprising:
a first clamping diode electrically coupled between a DC supply and the first electronic switch, for providing a clamping voltage to the first electronic switch;
a second clamping diode electrically coupled between a DC supply and the second electronic switch, for providing a clamping voltage to the second electronic switch; and
a third clamping diode electrically coupled between a DC supply and the third electronic switch, for providing a clamping voltage to the third electronic switch.

16. The circuit of claim 11, further comprising:
a first clamping circuit, for providing at least two different clamping voltages to the first electronic switch;
a second clamping circuit, for providing at least two different clamping voltages to the second electronic switch; and
a third clamping circuit, for providing at least two different clamping voltages to the third electronic switch.

* * * * *